United States Patent

Ahmad et al.

[11] Patent Number: 5,946,588
[45] Date of Patent: Aug. 31, 1999

[54] LOW TEMPERATURE SUB-ATMOSPHERIC OZONE OXIDATION PROCESS FOR MAKING THIN GATE OXIDES

[75] Inventors: Aftab Ahmad; Randhir P. S. Thakur; J. Brett Rolfson, all of Boise, Id.; Brian Benard, San Jose, Calif.

[73] Assignee: Micron Technology, Inc., Boise, Id.

[21] Appl. No.: 08/779,602

[22] Filed: Jan. 7, 1997

Related U.S. Application Data

[63] Continuation of application No. 08/350,859, Dec. 7, 1994, abandoned.

[51] Int. Cl.$^6$ .................................................. H01L 21/316
[52] U.S. Cl. ........................................... 438/585; 438/770
[58] Field of Search ..................................... 437/983, 239, 437/242, 69, 40; 142/DIG. 117, DIG. 85, DIG. 86, DIG. 118; 438/585, 770, FOR 177, FOR 193, FOR 494

[56] References Cited

U.S. PATENT DOCUMENTS

| | | |
|---|---|---|
| 5,294,571 | 3/1994 | Fujishiro et al. ......................... 43/239 |
| 5,330,935 | 7/1994 | Dobuzinski et al. . |
| 5,352,620 | 10/1994 | Komori et al. . |

FOREIGN PATENT DOCUMENTS 5175190  7/1993  Japan .

OTHER PUBLICATIONS

Nayan et al, "Atmospheric Pressure, Low Temperature (500°) UV/ozone Oxidation of Silicon", Elect. Lett. Feb., 1,1990, Oct. 26, No. 3, pp. 205–206.

Kazor, A., et al, "Ozone Induced Rapid Low Temperature Oxidation of Silicon", Appl. Phys. Lett., 63(18) Nov. 1, 1993 pp. 2517–2519.

Kazor, A., et al, "Growth Rate Enhancement Using Ozone . . . Silicon", Appl. Phys. Lett. 65(4), Jul. 25, 1994, pp. 412–414.

*Primary Examiner*—George R. Fourson

[57] ABSTRACT

A process for making thin gate oxides comprising the layering of a semiconductor substrate with at least an oxide layer and a nitride layer. The layers are then patterned and etched, thereby exposing portions of the substrate. The substrate is then doped, thereby creating a channel stop region. The exposed portions of the substrate are oxidized, thereby creating a field oxide region. The oxide and nitride layers are removed, thereby exposing sites of active areas, and a gate oxide layer grown in an ozone-containing atmosphere.

12 Claims, 2 Drawing Sheets

LOW TEMPERATURE SUB-ATMOSPHERIC OZONE OXIDATION PROCESS FOR MAKING THIN GATE OXIDES

This application is a continuation of application Ser. No. 08/350,859, filed Dec. 7, 1994, now abandoned.

FIELD OF THE INVENTION

This invention relates to semiconductor manufacturing, and more particularly to forming thin gate oxides.

BACKGROUND OF THE INVENTION

The thermal oxidation of silicon is a vital process in the fabrication of semiconductor devices. A great deal of effort has been expended in characterizing the process and understanding the results.

Current processes for thin gate oxide growth involve high temperature oxidation that tends to diffuse the channel implant away from the channel. To compensate for this diffusion, higher channel implant doses are required to maintain reasonable threshold voltages, as well as sub-threshold leakage.

Higher channel doses also effect the N+ junction under the gate edges, resulting in higher e-field, as well as leakage mechanism thus raising the question of device reliability.

SUMMARY OF THE INVENTION

The process of the present invention, uses ozone oxidation to grow thin gate oxide useful for deep sub-half micron devices where a shallow channel implant is necessary to maintain the required surface concentration of dopant at the silicon surface.

At 700° C., Applicants are able to grow an ozone gate oxide to a thickness of 110 Å or less. The low temperature gate oxidation process of the present invention requires less of an enhancement dose of dopant (which is typically implanted prior to gate oxide growth through the sacrificial oxide).

The reduced enhancement doping is very much needed for P-channel devices in order to control Yj (the junction depth of the channel implant or enhancement in a P-channel buried channel process), and thereby maintain short channel characteristics. The shallower the junction depth of a channel implant for a P-channel MOSFET, the better the short channel characteristics which are achieved. At the same time, the reduced enhancement doping provides the optimum surface concentration for the N-channel MOSFETs without effecting the N+ sidewall junctions.

One aspect of the present invention is a low temperature oxidation process for fabricating thin oxide layers comprising growing a gate oxide in an ozone-containing atmosphere, which atmosphere is generated at a temperature substantially in the range of 600° C. to 957° C.

Another aspect of the present invention is a process for making thin gate oxides comprising the layering of a semiconductor substrate with at least an oxide layer and a nitride layer. The layers are then patterned and etched, thereby exposing portions of the substrate. The exposed portions of the substrate are oxidized, thereby creating a field oxide region. The substrate is then doped, thereby creating a channel stop region. The oxide and nitride layers are removed, thereby exposing sites of active areas, and a gate oxide layer grown in an ozone-containing atmosphere.

A further aspect of the present invention is a method of fabricating thin dielectric layers comprising growing a field oxide region in a semiconductor substrate, doping the semiconductor substrate to form channel stop regions, and growing a thin oxide layer having a thickness 110 Å or less in an ozone-containing atmosphere at approximately 700° C.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

For ease of discussion, the process of the present invention is being discussed with reference to the standard LOCOS process. However, this is only an illustrative embodiment, as the process of the present invention is adaptable for use with other LOCOS schemes and other isolation methods.

Figure 1:
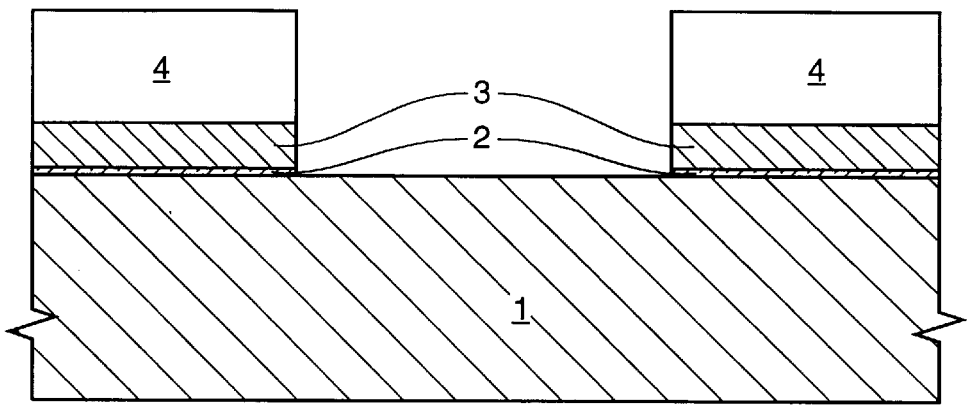
FIG. 1 is a schematic cross-section of a semiconductor substrate which has been masked and doped, according to the process of the present invention.

FIG. 1 illustrates the standard LOCOS process, in which a pad oxide layer 2 is formed upon a semiconductor substrate 1. The pad layer 2 is created either by thermal growth or by deposition. Superjacent the pad oxide 2, is formed a silicon nitride layer 3 which functions as an oxidation barrier. The nitride layer 3 is typically deposited by chemical vapor deposition (CVD).

A mask 4 is patterned superjacent the sites where the active areas will be formed. The silicon nitride layer 3 and pad oxide layer 2 are etched, thereby exposing the semiconductor substrate 1.

The semiconductor substrate 1 is then exposed to a steam ambient and the field oxide 5 is grown. The field oxidation step is preferably done before the channel stop region is formed, so that the diffusion of the boron is minimized due to the oxidation in a steam ambient.

The field oxide region 5 is then doped to form channel stop regions 6. Low temperature oxidation causes less boron diffusion into the substrate 1, thus allowing higher concentrations under the field oxide 5. The diffusion of boron species is a strong function of temperature; the diffusion being lower at lower temperatures.

A higher concentration serves the purposes of lessening the dose for the channel stop implant that gives a better field oxide threshold voltage, and also lessens the junction leakage at the field oxide 5 edges due to less electrical encroachment, thereby improving the refresh in the DRAM.

In an alternative embodiment, the field oxide region 5 is grown by oxidizing the exposed substrate 1 in an ozone-containing ambient. See, for example, U.S. patent application Ser. No. 08/181,650, entitled, "Improved Process for Creating Silicon Dioxide Field Isolation Regions on a Silicon Substrate Using Ozone Chemistries," also assigned to Micron Semiconductor, Inc.

Figure 2:
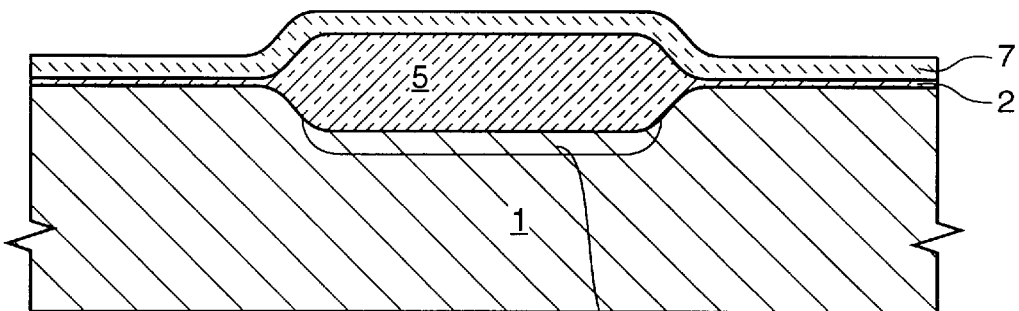
FIG. 2 is a schematic cross-section of the substrate of FIG. 1, after a field oxide region has been grown, according to the process of the present invention.
Figure 3:
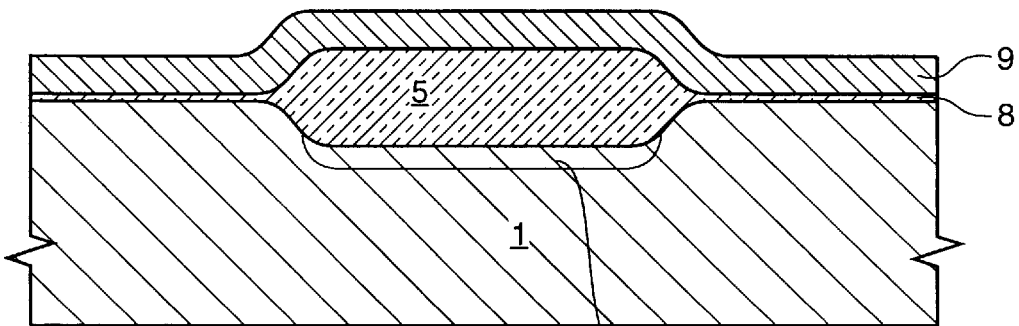
FIG. 3 is a schematic cross-section of the substrate of FIG. 2, on which has been formed a gate oxide and layer of polysilicon, according to the process of the present invention.
Figure 4:
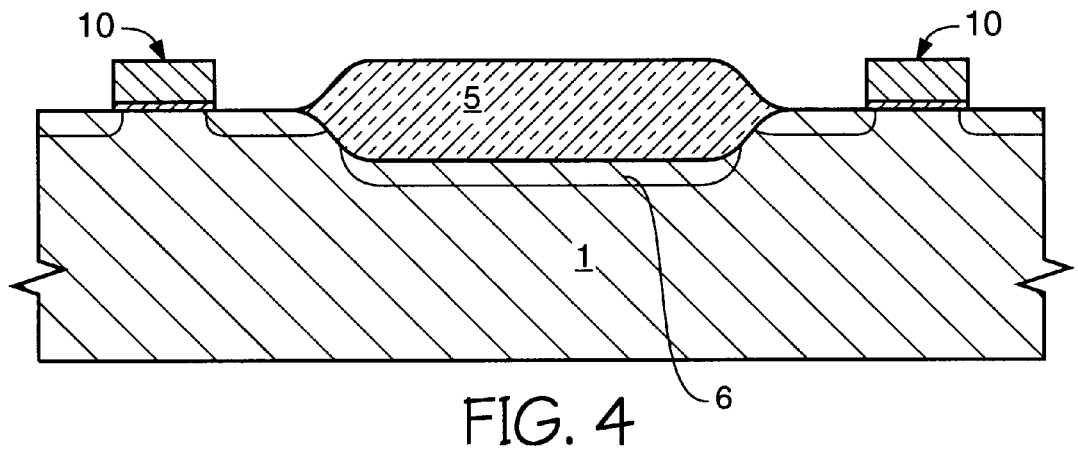
FIG. 4 is a schematic cross-section of the substrate of FIG. 3, after the gate devices have been formed, according to the process of the present invention.

The mask 4, the silicon nitride layer 3, and the pad oxide layer 2 are stripped off, and a sacrificial oxide layer 7 is grown and then stripped away, as illustrated in FIG. 2. The sacrificial oxide 7 is used to remove any nitride impurities that have impacted the substrate 1.

A thin gate oxide layer 8 is then formed. The thin gate oxide 8 of the present invention has a thickness of 110 Å or less. A polysilicon layer 9 is disposed superjacent the gate oxide layer 8, and transistors are created at the active area sites.

In the process of the present invention, the thin gate oxide 8 is formed using ozone oxidation at low temperatures. The ozone gate processes are run at temperatures in the approximate range of 600° C. to 960° C. The preferred temperature range is 750° C. to 910° C.

Oxidation in the presence of ozone dramatically increases the oxidation rate over dry oxidation. The faster oxidation rates permit the use of the lower oxidation temperatures, which in turn, result in less stress, reduced electrical encroachment, and a reduced amount of enhancement dose of dopant. The reduced enhancement doping is very much needed to maintain short channel characteristics.

Each wafer may be processed individually in a single wafer processor, or multiple wafers may be processed in a conventional vertical thermal reactor. Applicants used a Silicon Valley Group (SVG) vertical furnace having a gas flow rate of 5 standard liters/minute at a pressure of 350 torr. The composition of the gas was 5% $O_3$ in bulk $O_2$. It is contemplated that the oxidation rate will increase further with increased levels of ozone concentration.

The reactor is a standard, low pressure vertical furnace system configured to run at sub-atmospheric pressures (e.g. at least 1 Torr) when creating the oxide film 8. Alternatively, other single wafer radially heated systems, such as rapid thermal processors, laser heated in plasma assisted CVD systems can also be used.

Increased oxidation rates have been observed at a pressure of 350 torr. It is believed that a reduction in the pressure increases the mean free path of atomic oxygen from the time of generation to collision with either diatomic oxygen or other free oxygen atoms. Thus, the time that the diatomic oxygen is available for reaction with the silicon of the substrate is increased.

The system exhibits depletion of reactants similar to other Low Pressure Chemical Vapor Deposition (LPCVD) processes (e.g., polysilicon and nitride depositions). This depletion of reactants is not typical of oxidation processes. The depletion of reactants is attributed to the depletion of the ozone reactants. The depletion requires a non-uniform temperature control across the reactor load to achieve similar effective oxidation rates. This is also typical of other LPCVD processes.

Variations in the number of wafers run in the load or the distance between the wafers does not appear to affect the film thickness, nor the reactor load uniformity.

Processes were run with the ozone/oxygen flow controlled both prior to and after diversion of the flow for sampling of ozone concentration. This has enabled an investigation of the oxidation rate at different react flow rates. The conclusion is that the oxidation rate is independent of reactant flow rate. This is typical of oxidation processes.

Ozone concentrations have been run at known conditions as high as 10%, with 7% being a previous "standard," due to limitations of a then-existing ozone generator. A new generators which should allow experimentation up to a possible 20% are not available. It is believed even greater results will be achievable with such a generator.

The use of a small amount of nitrogen with the generator has affected the oxidation rate, even at 25 sccm $N_2$ in a 5 standard liters/minute of ozone/$O_2$. The nitrogen is used to increase the efficiency of the ozone generator, and its effective lifetime.

The ozone increases the effective oxidation rate of silicon, compared to dry oxygen alone. The increase in oxidation rate appears to be a function of ozone concentration as well, with a higher ozone concentration causing a greater increase in oxidation rate compared to dry oxygen. The effect of the nitrogen in the ozone/$O_2$ reactant flow with the new generator is expected to have comparable results to those of the standard generators.

Ozone oxidation in a rapid thermal processor also produces thin gate films. The advantage in that case is the immediate ability for in-situ nitridization using $N_2O$/NO and re-oxidation to build a stacked dielectric, with superior film thickness uniformity compared to the furnace process. The re-oxidation fills the pinholes, and thereby avoids excess leakage, which improves the cell dielectric reliability, and consequently, the refresh time of the memory cell, such as a DRAM.

In-situ precleans can be done prior to oxidation, as well as to engineer the properties of the gate dielectric.

The low thermal budget provided by the low temperature oxidation (i.e., 600° C.–950° C.) of the present invention is useful for reducing the overall thermal budget in sub-half micron densities.

Recent characterization of the ozone gate oxide film 8 grown at approximately 900° C. shows the film 8 has at least comparable breakdown voltage mean and distributions compared to dry oxides and dry/wet/dry oxides grown at 800° C. At 750° C., the ozone gate oxide thickness of 90 Å or less is also comparable. This is advantageous in that the lower temperature gate dielectrics have inferior breakdown and lifetime characteristics, when not annealed, as proposed by the present invention.

The refractive index of the 750° C. ozone oxide indicates that it is not a poor quality oxide, i.e., neither excessively silicon nor excessively oxygen rich. The extra oxygen species introduced which enhance oxidation and which have higher diffusivity through the gate oxide film 8 during oxidation prevents a silicon-rich film from forming. The greater diffusivity and reactivity of these species provide a better film uniformity than a DCS/$N_2O$ (dichlorosilane/nitrous oxide) process for depositing a gate dielectric with higher quality.

Figure 5:
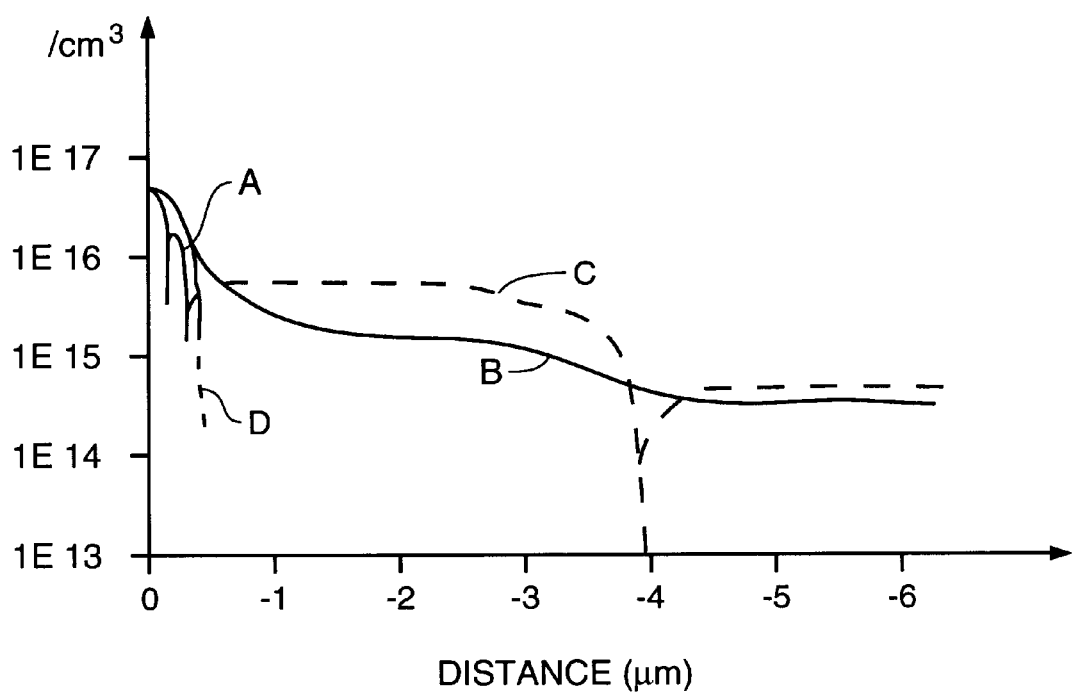
FIG. 5 is a graph indicating the Concentration vs. Distance on the dopant in the N-well and P-well.

FIG. 5 illustrates the buried channel in an N-well formation due to a boron enhancement implant, the channel adjustment implant is portrayed by curve D. Curves B and C characterize the dopant density versus depth of respective P- and N-wells of a substrate. Curve A illustrates the density versus depth of dopants for a buried channel PMOSFET. The more shallow the buried channel, the better the short channel characteristics of the PMOSFET achieved. One purpose of the process of the present invention is to make the buried channel shallow by allowing less thermal cycle during gate oxidation.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

Although the process of the present invention has been discussed with reference to the standard LOCOS process, one having ordinary skill in the art, upon being apprised of the invention, would appreciate its use with other isolation schemes, such as poly-buffered LOCOS, recessed LOCOS, etc.

What is claimed is:

1. An oxidation process for fabricating an oxide layer, said process comprising the following step of:

growing an oxide in an ozone-containing atmosphere, said atmosphere having a sub-atmospheric pressure from 1 torr to 350 torr and a temperature between 500° C.–800° C., wherein said oxide is provided a thickness of 110 Å or less.

2. The oxidation process of claim 1, wherein said atmosphere comprises ozone/oxygen flowed at a rate of 5 standard liters/minute.

3. An oxidation process for fabricating an oxide layer, said process comprising a step of:

growing an oxide in an ozone-containing atmosphere, said atmosphere having a sub-atmospheric pressure of approximately 350 torr and a temperature between 500° C.–800° C., wherein said oxide is provided a thickness of 110 Å or less.

4. A method of fabricating thin dielectric layers, said method comprising the following steps of:

growing a field oxide region in a semiconductor substrate;

doping said semiconductor substrate to form channel stop regions; and growing a thin oxide layer in an ozone-containing atmosphere at approximately 700° C., and at a sub-atmospheric pressure between 1 torr and 350 torr, said thin oxide layer being provided a thickness of 110 Å or less.

5. The method of fabricating thin dielectric layers, according to claim 4, wherein said thin oxide layer is grown at a rate of 12 Å/min.

6. The method of fabricating thin dielectric layers, according to claim 5, further comprising the step of:

enhancement doping said semiconductor substrate, said enhancement doping is at a level of $3\times10^{16}$ to $5\times10^{17}$ atom/cm$^3$.

7. The method of fabricating thin dielectric layers, according to claim 6, wherein said ozone-containing atmosphere comprises 5%–7% ozone ($O_3$) with respect to bulk oxygen ($O_2$).

8. The method of fabricating thin dielectric layers, according to claim 7 wherein 25 sccm of nitrogen ($N_2$) is added to said ozone-containing atmosphere.

9. A process for making gate oxides, said process comprising the following steps of:

layering a semiconductor substrate with at least an oxide layer and a nitride layer;

patterning and etching said layers, thereby exposing portions of said substrate;

oxidizing said exposed portions of said substrate, thereby creating a field oxide region;

doping said substrate, thereby creating a channel stop region;

removing said oxide and nitride layers, thereby exposing sites of active areas; and growing a gate oxide layer in an ozone-containing atmosphere having a sub-atmospheric pressure between 1 torr and 350 torr, wherein said gate oxide is provided a thickness of 110 Å or less.

10. The process for making thin gate oxides, according to claim 9, wherein said substrate is doped to a level of $3\times10^{16}$ to $5\times10^{17}$ atom/cm$^3$.

11. The process for making gate oxides, according to claim 10, wherein said ozone-containing atmosphere comprises 5% ozone ($O_3$) with respect to bulk oxygen ($O_2$) flowed at a rate of 5 standard liters/minute.

12. The process for making gate oxides, according to claim 11, further comprising the steps of:

disposing a layer of polysilicon superjacent said gate oxide layer; and creating transistors from said polysilicon layer and said gate oxide layer.

* * * * *